United States Patent [19]

Chapman

[11] 4,435,785
[45] Mar. 6, 1984

[54] UNIPOLAR VOLTAGE NON-VOLATILE JRAM CELL

[75] Inventor: Richard A. Chapman, Dallas, Tex.

[73] Assignee: Texas Instruments Incorporated, Dallas, Tex.

[21] Appl. No.: 269,201

[22] Filed: Jun. 2, 1981

[51] Int. Cl.³ .................... G11C 11/24; H01L 29/80
[52] U.S. Cl. ................................ 365/147; 357/22; 365/218
[58] Field of Search ............... 365/149, 191, 218; 357/22, 23 CS

[56] References Cited

U.S. PATENT DOCUMENTS 4,156,939   5/1979   Takemae et al. ................ 365/149

OTHER PUBLICATIONS

IBM Technical Disclosure Bulletin, vol. 23, No. 3, Aug. 1980, p. 1058, Dual Dielectric Capacitor, J. K. Howard.

*Primary Examiner*—George G. Stellar
*Attorney, Agent, or Firm*—Gary C. Honeycutt; Melvin Sharp; James T. Comfort

[57] ABSTRACT

A non-volatile JRAM cell is constructed to require only positive voltage for programming and erasing of data in the cell. The "well" region of the cell JFET device may be implanted with an impurity concentration that will permit lower breakdown voltage or the non-volatile gate may overlap the JFET gate sufficiently to be able to have the same effect, or some combination of both may be used. This allows the cell to be erased using voltages of one polarity.

9 Claims, 7 Drawing Figures

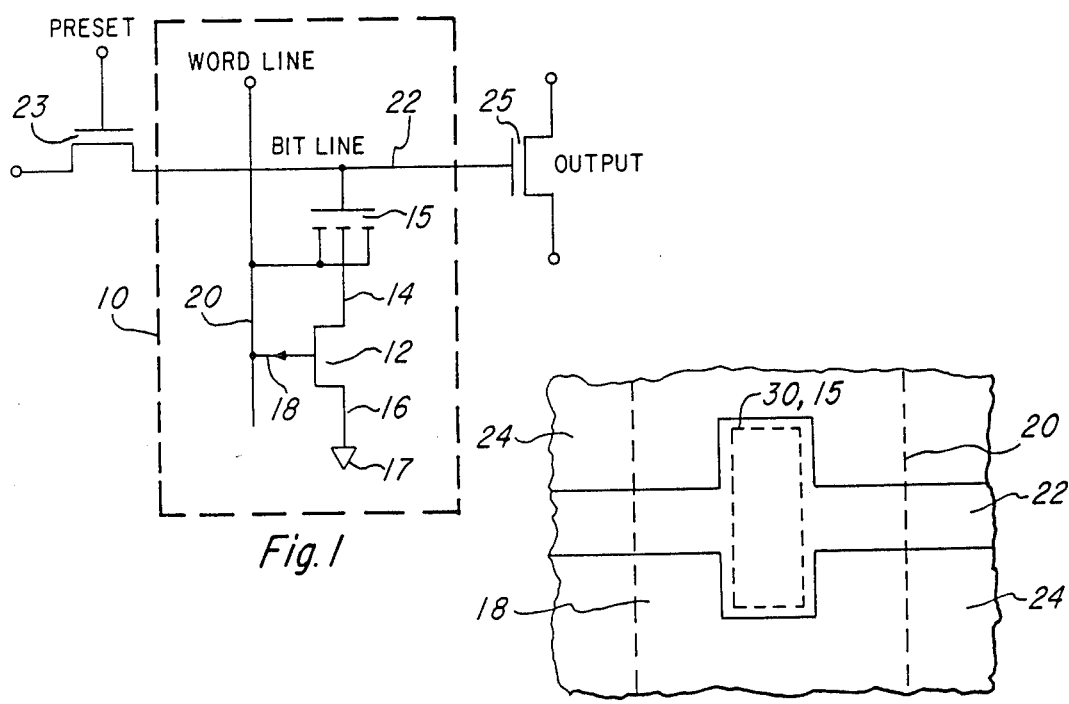
Fig. 1
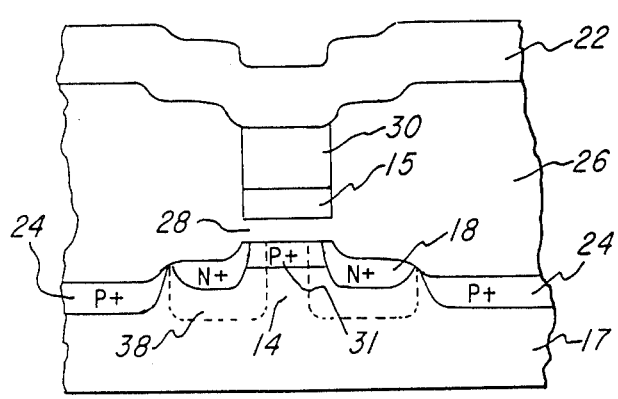
Fig. 2
Fig. 3
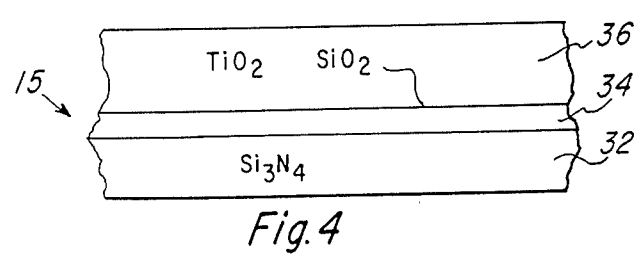
Fig. 4

(A) INVERSION LAYER ON SURFACE OF JFET SOURCE (B) ACCUMULATION LAYER ON SURFACE OF JFET SOURCE

UNIPOLAR VOLTAGE NON-VOLATILE JRAM CELL

BACKGROUND OF THE INVENTION

This invention relates to semiconductor memories, a more specifically to a non-volatile random access memory cell comprised of a virtual junction field effect transistor and to arrays thereof.

In previous NVJRAMs, positive and negative voltages are used to program and erase the memory state of the cell, respectively. If both positive and negative programming voltages are to be used, then CMOS technology must be used in the peripheral circuitry fabrication. This means utilizing a more complicated fabrication process for completion of an array with peripheral circuitry on the same chip than would be required for the memory elements which are NMOS. The present invention discloses a cell similar to that described in U.S. patent application Ser. No. 228,413. A method of making this cell is described in copending application Ser. No. 264,888 filed May 18, 1981.

In the standard non-volatile JRAM cell, voltages of both positive and negative polarity are required to program and erase the memory element. The use of both polarities of voltage on a chip requires CMOS technology to implement the full devices of the array. In order to avoid the requirement for the more expensive and complicated CMOS, one alternative is to use a cell having an operating voltage of only one polarity for both programming the erasing. The use of a cell such as this would eliminate both the need for two polarities of operating voltage, and two types of semiconductor technology on the same chip. It is an object of this invention to provide a non-volatile memory cell using low voltages and having fast programming times for both write and erase states, using the same polarity of pulse voltage for both operations. It is also an object of the invention to provide a cell which is implemented in the technology that will enable peripheral devices for array cells to be built on the same substrate.

SUMMARY OF THE INVENTION

A non-volatile memory cell using low voltages and having fast programming times can only be obtained using highly efficient programming mechanisms. Unipolar voltage operation for NMOS and dual dielectric MOSFETS has been obtained in the past using avalanche-tunnel injection as shown by Y. Uchida et al in "A New Non-Volatile Read-Write Random Access Memory Operation by Means of Avalanche-Tunnel Injection in NMOS transistor", Journal of Japan Society of Applied Physics, Volume 42, Page 151, 1973, and "A 10-24 Bit-NMOS Ram Using Avalanche-Tunnel Injection", IEEE Journal of Solid State Circuits, Volume SC-10, Page 288, 1975. Avalanche punch-through erase is shown by D. Kahng, J. R. Brews, and W. J. Sundburg, "Avalanche Punch-Through Erase Mode in Dual-Dielectric Charge-Storage (DDC) Cells", IEEE Transactions on Electron Devices, Volume ED-24, Page 531, 1977. In these devices, the write operation is obtained by placing a large voltage on the gate with the substrate, source, and drain all grounded, thus pulling the charge of a polarity opposite to the gate voltage into the insulator; to erase a voltage pulse of the same polarity as used in the write operation is placed on the source and drain simultaneously with the gate and substrate grounded.

Erasure occurs through the action of the junction breakdown at the source and drain (as modified by the MIS gate) creating carriers which flow to the channel region of the MOSFET and are then momentarily trapped in the channel. The carriers flowing to the channel region are majority carriers in the channel rather than minority carriers (minority carriers would form a channel inversion layer under proper MIS gate bias). These majority carriers are momentarily trapped in the channel by the confining action of the source and drain and by the potential barrier underneath the channel as created by merging (punch through) of the depletion layers of the source and drain which have been strongly reverse biased to obtain breakdown. To the extent that majority carriers are trapped in the channel region, the channel potential will rise momentarily, thus creating an electric field in the insulator which is opposite in sign to that existing during the write operation. During erasure either the charge in the insulator is forced into the channel or the majority carriers in the channel (charge of sign opposite to that of the charge previously written in the insulator) are forced in through the insulator. Unfortunately, in a MOSFET, the majority carriers are not entirely confined to the channel and can leak away to the substrate through the two sides of the MOSFET channel adjacent to the channel stop which is underneath the field oxide as shown in Kahng and Brews. The escape of carriers to the channel stop decreases the efficiency of the erase mechanism since the channel voltage will not rise to as large a value as would be the case if the channel were completely isolated. Unlike the MOSFET structure, the NVJRAM structure completely seals off the channel under punch through conditions because the source and drain have been joined together, thus surrounding the channel surface on all four sides, in addition to the potential barrier underneath the channel caused by punch through.

In addition to the erasure mechanism described above in which the thermalized, trapped majority carriers tunnel to the memory insulator, hot carriers from the diode breakdown can overcome the silicon oxide potential barrier and enter the insulator as shown in both the Uchida articles and also in H. Hara, et al, "Avalanche-Injection MOS Read-Only Memory", Proceedings of the Third Conference on Solid State Devices, Tokyo 1971, Supplement to Oyo Buturi, Volume 41, Page 163, 1972. This process is more efficient for P channel MOSFET's compared to N channel MOSFET's because the barrier for electrons (majority carriers in the P channel layer) is smaller than for holes as shown by Hara. Since the hot majority carriers thermalize as they leave the diode junction region underneath the MIS gate, the hot carrier erasure process is more effective near the junction resulting in a non-uniform, time dependent erasure of the insulator charge in the NMOS or multi-dielectric erasure of the insulator charge in the NMOS or multi-dielectric structures.

In an MOSFET where many of the majority carriers created by the breakdown mechanism escape to the channel stop, the erasure mechanism is not highly efficient and the breakdown current must flow for a longer time to obtain erasure; the increased duration of breakdown current flow increases the contribution of hot carriers to the erasure process. In the unipolar voltage NVJRAM, the hot majority carriers still contribute to the erasure process, but the erasure process due to the thermalized channel carriers is increased in efficiency, resulting in an erasure which is more uniform over the channel surface. One aspect of the present invention is embodied in a non-volatile memory cell having a single vertical JFET as the addressing element and, for example, a dual dielectric or a multi-dielectric NMOS structure as the charge storage element. The substrate forms the drain of the JFET and a diffusion region having the same conductivity type as the substrate forms the source. The non-volatile storage element overlaps and is separated from a source region by a thin gate oxide. A diffused region of the opposite conductivity type forms the gate of the JFET and also a word line of memory matrix formed of a plurality of the cells. A thick oxide layer overlies the diffused word line and surrounds the storage element, and a conductive bit sense line is formed, for example, of aluminum, orienting perpendicularly to the word line and contacting the storage element. In another embodiment, the charge storage element is a silicon floating gate separated from the vertical JFET source by a thin insulator and separated from a control gate (above the floating gate) by another insulator with the rest of the NVJRAM structure being the same as in the first embodiment. In yet another embodiment, a dual dielectric contains a dopant or small conducting islands at the interface of the two dielectrics with the non-volatile charge stored on the dopant or conducting islands. An individual cell according to the present invention requires an area as small as 0.25 mil squared, providing an extremely high density non-volatile random access memory.

BRIEF DESCRIPTION OF THE DRAWINGS

The novel features believed characteristic of the invention are set forth in the appended claims. The invention itself, however, as well as further objects and advantages thereof, will be best understood by reference to the following detailed description when read in conjunction with the accompanying drawings, wherein:

FIG. 1 is a schematic diagram of a data storage cell according to the present invention;

FIG. 2 is a partial, vertical cross-sectional view of the storage cell of FIG. 1;

FIG. 3 is a plan view of the cell of FIG. 2;

FIG. 4 is a cross-sectional view of the storage element of the present cell;

DETAILED DESCRIPTION OF THE DRAWINGS

Figure 5:
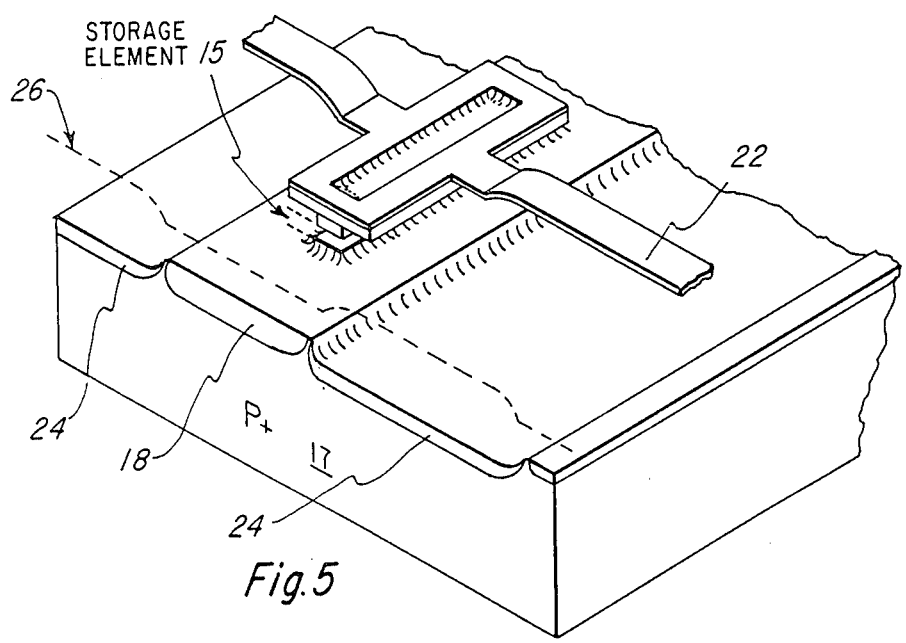
FIG. 5 shows operating waveforms of a unipolar voltage NVJRAM cell.
Figure 6A:
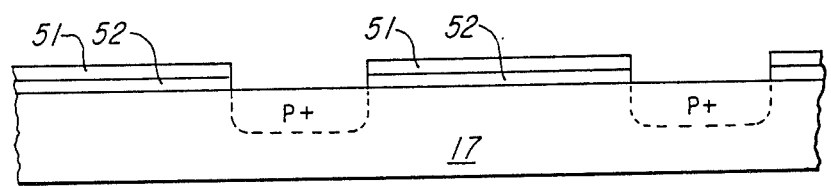
FIG. 6 shows the construction of a 2×2 unipolar voltage NVJRAM array.
Figure 6B:
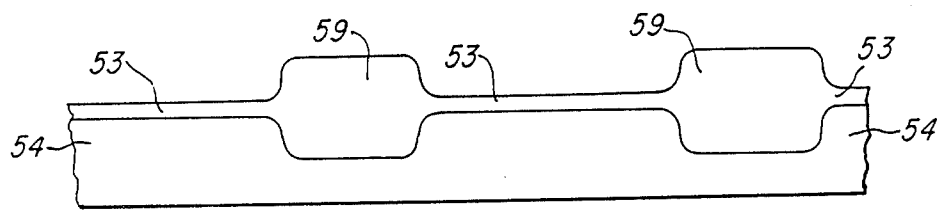
Figure 6C:
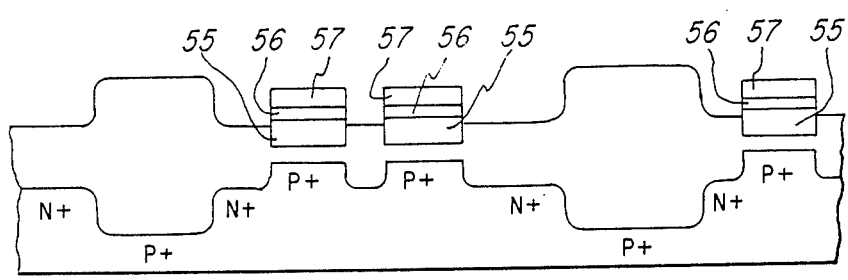
Figure 6D:
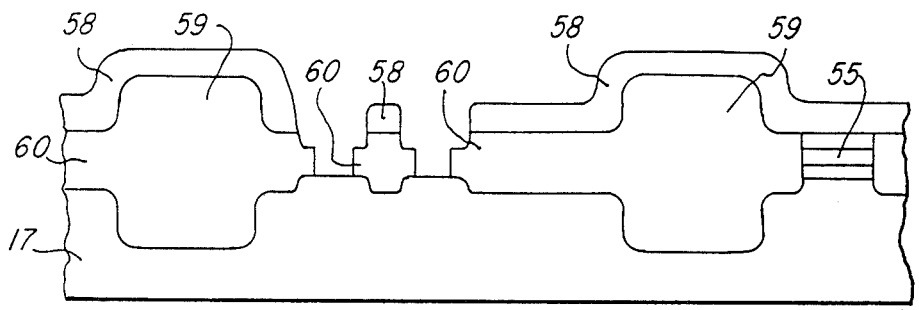
Figure 6E:
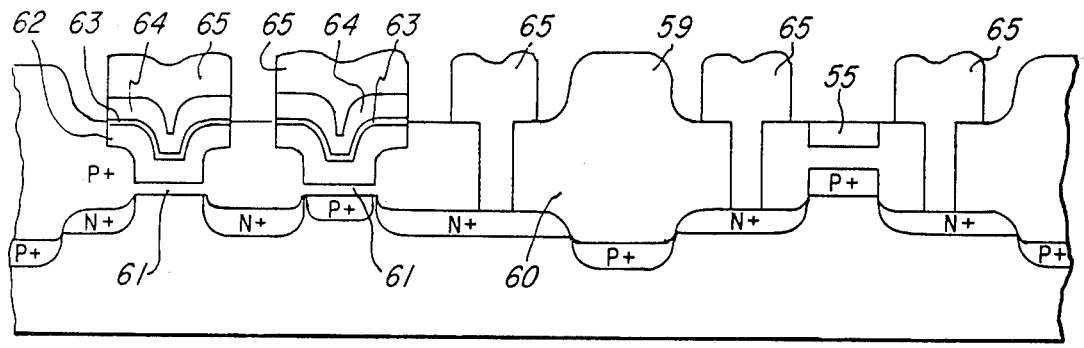

Referring now to the drawings, there is shown in FIG. 1 a schematic diagram of a single, non-volatile, junction field effect transistor random access memory (JRAM) cell 10 according to the present invention. Memory cell 10 is formed of a vertical JFET 12 having a source 14 capacitively coupled to a storage element 15, a drain 16 directly connected to the substrate 17, and a gate 18 which is part of a word line 20. Storage element 15 is also coupled to a bit sense line 22. A typical random access memory is formed of a matrix of cells 10 coupled to a plurality of rows of sense lines 22 and columns of word lines 20. A specific cell is addressed by simultaneous impulses on the corresponding bit sense and word lines. A preset transistor 23 and an output transistor 25 are provided for applying write and erase potentials to bit sense line 22 and for sensing the output of storage element 15 during the read operation. A sense latch as is commonly used with dynamic RAMs can be substituted for the output transistors 25.

Referring to FIGS. 2 and 3, the structure of the cell 10 may be better understood. A portion of a semiconductor substrate for example, silicon, is shown generally at 17. The substrate may be either N type or P type, depending upon design considerations. For purposes of illustration, it will be assumed that a P type substrate is utilized. Word line 20 is an N+ region which also forms the gates for all the JFET's in a column. A P+ region on either side of the gate region 18 forms a channel stop 24 to isolate the cell 10. A relatively thick insulating layer 26 of, for example, silicon dioxide overlying gate 18 and channel stop 24 regions and a thin gate oxide region 28 overlying the source 14 of JFET 12. Storage element 15 is formed of a multi-dielectric structure overlying gate oxide 28 and surrounding by oxide layer 26. Overlying the storage element 15 is a region 30 that forms a contact electrode that is coupled to a conductive strip, for example, aluminum, which forms bit sense line 22.

In a preferred embodiment of the present invention, the P type silicon substrate has an epitaxial layer with an impurity concentration on the order of $5 \times 10^{14}$ atoms per cubic centimeter and a thickness of 0.5 mils placed on a bulk substrate with a resistivity of 0.02 ohms-centimeters and a thickness of perhaps 20 mils. Channel stops 24 have a P+ conductivity formed by a boron ion implant of 2 to $8 \times 10^{13}$ per square centimeter at 40 KEV energy level, and gate region 18 and word line 20 are doped N+ by a phosphorus arsenic implant of 1 to $5 \times 10^{15}$ atoms per square centimeter at 60 KEV energy. Insulating oxide layer 26 has a thickness of about 8,000 to 14,000 angstroms overlying channel stops 24 and a thickness of 400 to 3,000 angstroms overlying gate region 18 adjacent to the storage element 15. Gate oxide 28 has a thickness of about 20 to 40 angstroms, and bit sense line 22 is formed, for example, by the evaporative deposition of aluminum to a thickness of about 12,000 angstroms. The contact region 30 may be part of the aluminum bit sense line or may be polysilicon or a metal silicide. A more heavily doped P+ region 31 is included in the source region 14, the dopant level lowering the avalanche breakdown voltage to the desired word line value and increasing the maximum dynamic read signal. Storage element 15, as described above, is a multi-diectric structure as shown in FIG. 4. In one embodiment, structure 15 is formed of a silicon nitride layer 32 having a thickness of 100 to 400 angstroms, a silicon dioxide layer 34 having a thickness of about 40 to 60 angstroms, and a titanium dioxide (rutile) layer 36 having a thickness of about 1,000 angstroms.

The charge storage structures are described by way of example only and are not intended to be a limitation as other structures will be apparent to those skilled in the art. For example, a tunnel junction floating gate structure may also be employed. Non-volatile information is stored in the cell by forcing charge into the non-volatile insulator stack 15. One charge state is written by placing a large voltage of, for instance, 15 volts by 100 nanoseconds on the bit sense line 22 while the substrate 17 and the gate 18 of the selected cell 1 are held at low voltage, for instance, 0 volts. Those cells on the bit sense line which are not selected for programming have their gate lines 18 held at an intermediate amplitude voltage, for instance, 5 volts which is sufficient to close the vertical JFET channel and to increase potential of the inversion layer which forms over the JFET source during programming. The intermediate voltage is chosen to be insufficient to cause perturbation of the memory state of the non selected cells. Writing or programming the above state can be termed writing a non-volatile "1" state. To erase or program the opposite state, a large voltage of, for instance, 15 volts for 100 nanoseconds of the same polarity as used in programming the one state is placed on a selected word line 24 with the selected cell 10 along the word line having a low voltage, for instance, 0 volts on its bit sense line 22. These voltages on the selected cell 10 result in closing the channel of the vertical JFET beneath the selected cell and in floating the JFET source which is then held at low voltage by the action of the high capacitance between source and bit sense line. Since the JFET source is held at low voltage while the JFET gate goes to high voltage, junction breakdown can occur between the source and gate of the JFET especially at the surface where the electric field between the bit sense line contact 30 and the JFET gate 18 act to increase the electric field in the depletion layer between the JEFT gate and source. If breakdown occurs between the voltage $V_{BK}$, then a voltage ($V_D - V_{BK}$) will appear on the JFET source when a voltage $V_D$ is applied to the JFET gate. The voltage $V_{BK}$ is in part dependent on the doping concentration in the JFET source, but is also dependent on the voltage of the bit sense line and the insulator thicknesses 28 and 15 and the charge previously programmed into insulator 15, with much lower $V_{BK}$ occurring for the thinner insulators and lower bit line voltages. Those cells not selected for erasure along the word line have intermediate amplitude voltages, for instance, 5 volts applied to their bit sense lines. This intermediate voltage does not have to be high because of the large effect of the voltage on 22 and 30 on the breakdown voltage $V_{BK}$. This erasure mechanism results in the charge in the insulator after writing the non-volatile 1 state being pulsed out of the memory insulator 15 into the JFET source, or alternatively, majority carriers (of charge sign opposite to that previously written in the layer 15) are pushed into 15 to cancel the previously written charge or to over-compensate this charge and write a charge state of opposite sign. In any case, this latter programming mechanism will be termed erasure or writing the non-volatile "0" state. This mechanism has the advantage of being self-limiting since the breakdown voltage $V_{BK}$ will increase as the charge in the insulator 15 is changed during the erasure process, thus automatically shutting off the erasure process.

In one embodiment, the structure of the unipolar voltage NVJRAM includes an overlap of the JFET gate 18 and the sense line contact 30. This overlap is needed in order that the voltage of the contact 30 can have a large effect on the breakdown voltage $V_{BK}$, this permits lower breakdown voltages for the selected cells which have contact 30 at, for instance, 0 volts and higher $V_{BK}$ for the unselected cells which have contact 30 at, for instance, 5 volts. A consideration of this construction is that the above overlap must be small enough to result in small overlap capacitance between the contact 30 and JFET gate 18. This overlap capacitance acts to lower the sense signal to be described next. In an alternate embodiment, the P-type carrier concentration of the JFET source 14 is increased to lower the breakdown voltage substantially using a thicker insulating 15 and 28. In another alternative embodiment, the larger P-type concentration is used and the insulator 28 thickness is increased only in the periphery of the JFET source above the N+P+ junction.

Although the information is stored in the memory insulator, the memory state must be sensed by the electrostatic action of the memory insulator on the surface of the JFET source. The charge state can be sensed dynamically by placing an intermediate amplitude voltage pulse of, for instance, 5 volts for 100 nanoseconds on the selected bit sense lines 22 and low voltage, for instance, 0 volts on the selected word line 24 with the unselected cells on the bit line having their word lines at an intermediate voltage sufficient to close their JFET channels, for instance, 5 volts. The bit line voltage of the selected cell is held at the intermediate voltage while the word line of the selected cell is increased to an intermediate voltage of, for instance, 5 volts sufficient to close its JFET channel. After the JFET channel of the selected cell is closed, the voltage on the selected bit line is lowered, for instance, to 0 volts. This operation is termed attempting to write a volatile "1". If the cell is in a non-volatile "1" state, the surface of the JFET source will be accumulated and the JFET source will be strongly capacitively coupled to the sense line contact 30 and the volatile write operation will result in the source being set in reverse bias with respect to the JFET drain or, silicon substrate. If the non-volatile 0 state had been previously written (the erase state), there would have been an inversion layer over the surface of the JFET source, resulting in an electrostatic shielding of the JFET source from the sense line contact 30; in this case, the result of the attempt to write a volatile "1" will have no effect on the JFET source potential and it will remain at substrate potential, for instance, 0 volts. The sense operation is completed by floating the sense line, by turning off the reset transistor 23 and then opening the selected cell JFET channel by lowering its word line 24 and JFET gate 18 to, for instance, 0 volts. If a volatile "1" state had been successively written, then the action of opening the JFET action will be to increase the JFET source voltage from its reverse bias to 0 volts. Since there is a large coupling capacitance between the JFET source and the bit line contact 30, the voltage of the floating bit line will rise to a value limited by the magnitude of the total parasitic capacitance on the selected bit line. If a volatile "1" had not been successively written, the act of opening the JFET channel will not change the JFET source voltage and the voltage step observed when a volatile "1" was successively written will not be observed. In summary, if a volatile "1" has been successively written, the memory insulator was in a non-volatile "1" state; if a volatile "1" state was not successively written, then the memory insulator was in a non-volatile "0" state. The storage time of the volatile state does not have to be as long as the corresponding volatile state in a dynamic RAM because the non-volatile data is stored in the memory insulator and the volatile write and read operations may quickly follow each other for instance within a few microseconds. In other words, the volatile state does not have to be maintained until the cell is reselected for sensing at a later time. This sense operation is described by the voltage waveforms of FIG. 5 using the circuit of FIG. 1. When a dynamic sense latch is used, two bit sense lines will be compared against each other with a dummy cell being activated in one sense while a non-volatile JRAM is being sensed on the first sense line.

Figure 7:
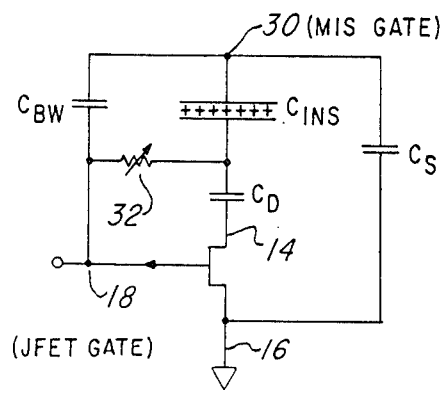
FIG. 7 shows the voltages using unipolar voltage JRAM with sensed latches.
Figure 7:
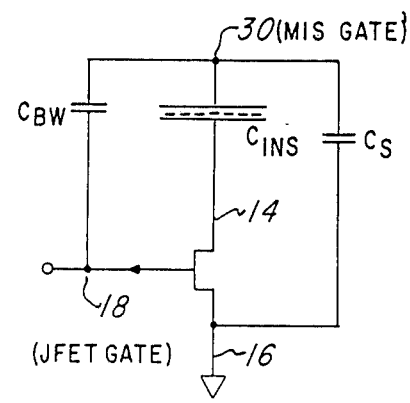
Figure 8:
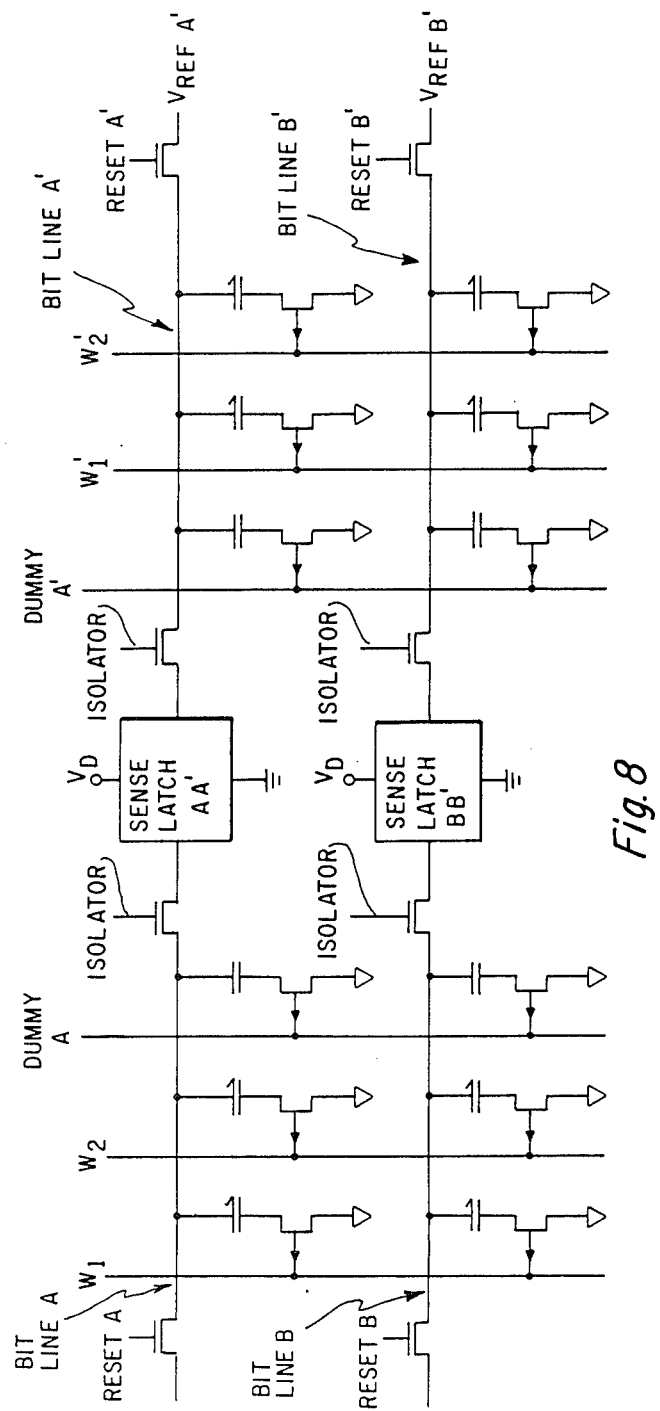
Figure 9:
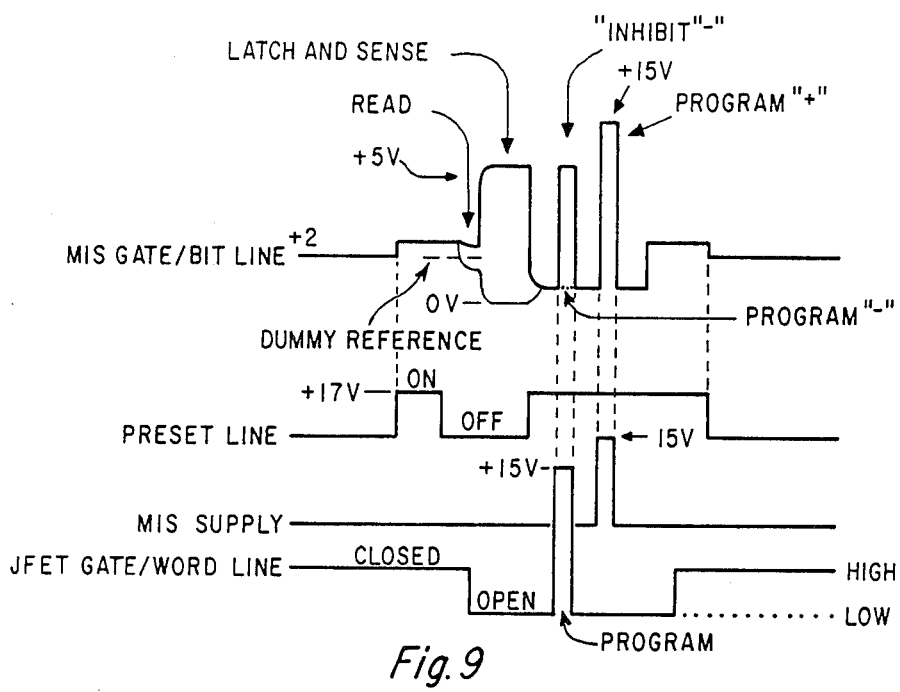
Figure 10:
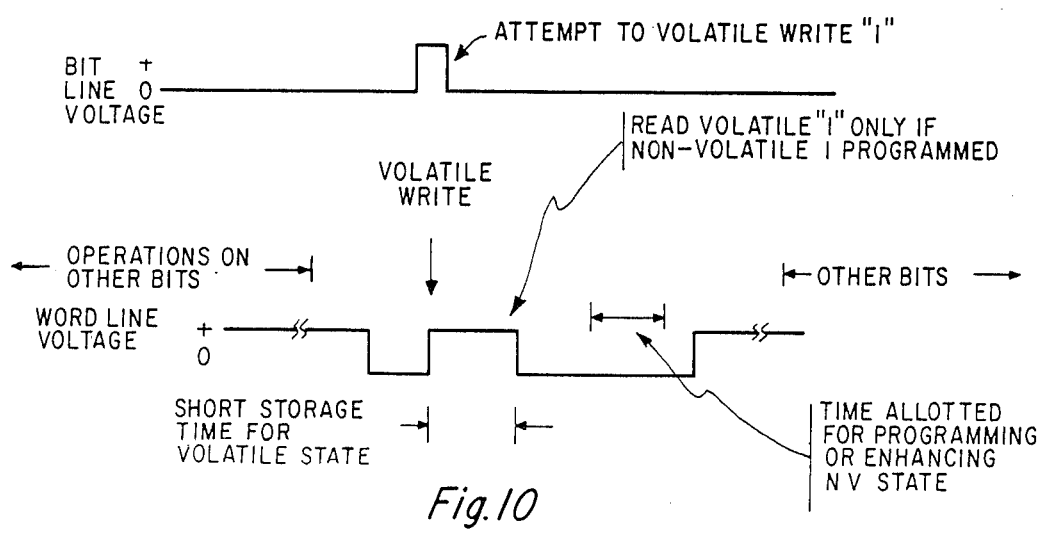
Figure 11:
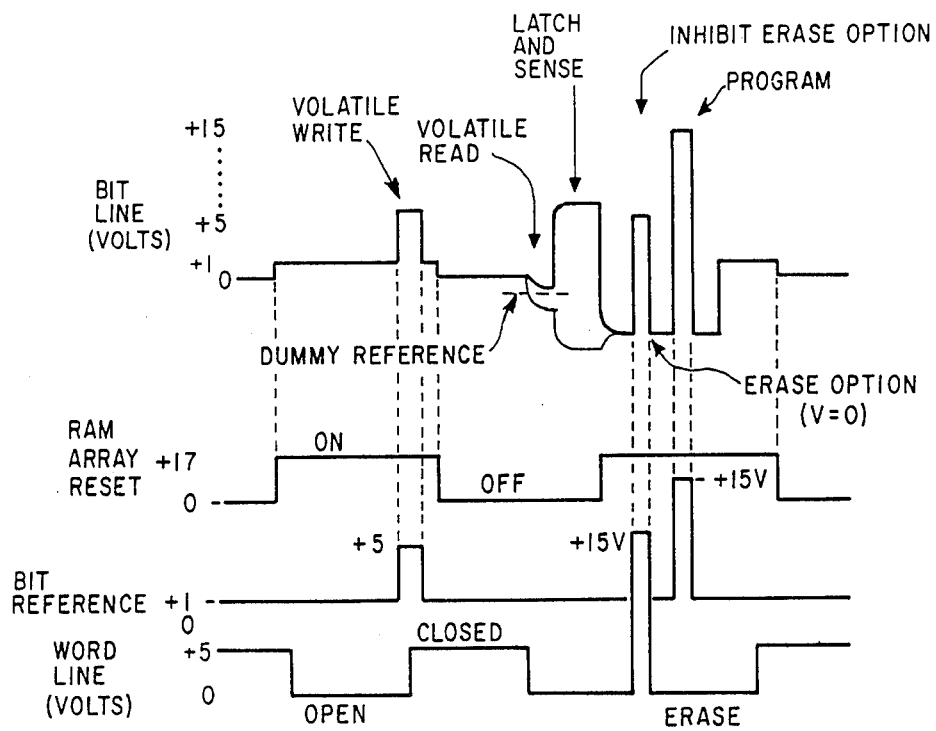
Figure 12:
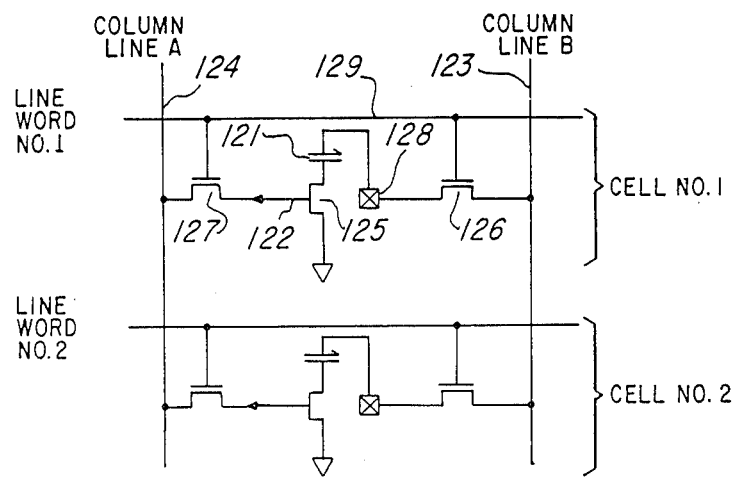
Figure 13:
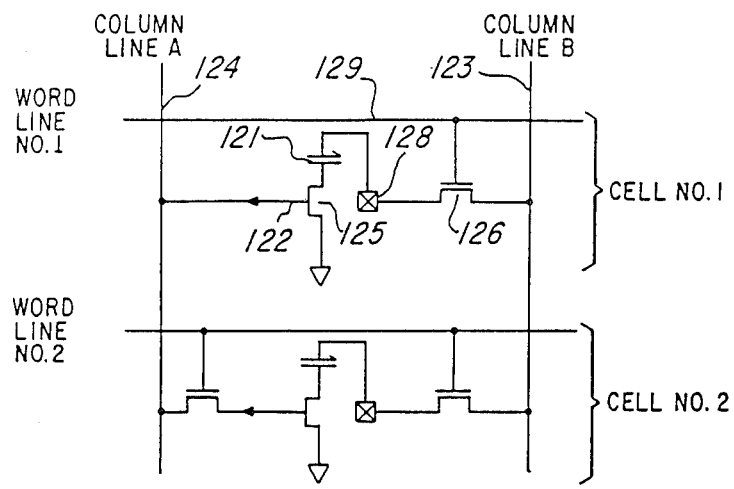
Figure 14:
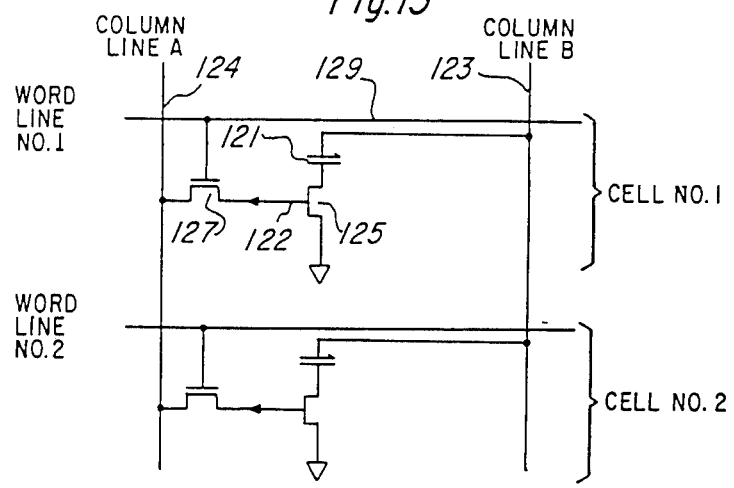
Figure 15:
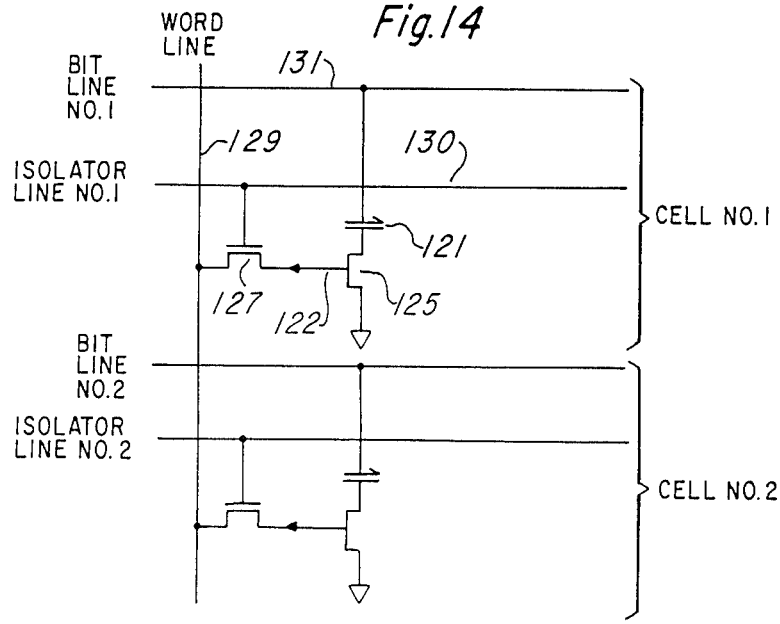

The memory construction using sense latches is shown in FIG. 6. A construction using folded bit lines should be obvious to those skilled in the art of dynamic RAMs. The dummy cells in FIG. 6 may be JRAMS without a non-volatile insulator or maybe a capacitor without non-volatile insulator. The dummy cell will be designed to provude a sense signal at the sense latch which is of an amplitude intermediate to that produced by sensing the NVJRAM in the non-volatile "1" state and the non-volatile "0" state. FIG. 7 shows the voltage waveforms when the array is operated with sense latches. In this design, writing a non-volatile "1" state can be accomplished through a reset MOSFET as in FIGS. 1 and 6 or by increasing the voltage $V_D$ supplied to the sense latch when the bit is floated prior to the read operation and the word lines and dummy lines are opened for the second time. The voltage on the bit line will change slightly to a value determined by the non-volatile state with the non-volatile "1" state giving the larger voltage. The activation of the dummy causes the other bit line attached to the sense latch to go to a voltage intermediate between that given by the non-volatile "1" and "0" state as shown by the dashed line in FIG. 7. The next step is to activate the sense latch which will then latch to a medium voltage, for instance, 5 volts, if the NVJRAM non-volatile state were 1 into a low voltage for instance, 0 volts if the state were 0. The state of the sense latch can now be interrogated. After interrogation, the state of the NVJRAM may be rewritten or reprogrammed or erased as shown in FIG. 7. It should be noted that the latching voltage may be used to reinforce the non-volatile state which has been read. If the sense latch latches to 5 volts, this is in the proper direction to reinforce the 1 state which was read. If the sense latch latches to 0 volts, the non-volatile state was 0 and the state may be reinforced by increasing the voltage of the activated word line while keeping the selected bit line at 0 volts. The unselected bit lines must be taken to an intermediate voltage, for instance, 5 volts, in order to inhibit the erase or program a 0.

Using the same unipolar voltage NVJRAM programming and erasing operations described herein, another sense operation can be used as described in copending application Ser. No. 269,926 filed June 2, 1981, in which the presence or absence of an inversion layer formed by the non-volatile state of the insulator 15 is sensed capacitively without the need to set a non-equilibrium voltage on the JFET source.

Although various embodiments of the present invention have been described with particularity, it is to be understood that modifications to the details thereof may be made without departing from the spirit and scope of the invention.

What is claimed is:

1. A non-volatile data storage cell having a P-channel JFET as the addressing element for the non-volatile storage element of said cell, said P-channel JFET having a source region of a higher level of impurity concentration for changing voltage breakdown threshold, wherein writing and erasing data in said cell is accomplished by voltages of the same polarity.

2. A cell as in claim 1, wherein said polarity of voltage is positive (+).

3. A cell as in claim 1, wherein said polarity of voltage is negative (−).

4. A random-access memory array of cells as in claim 1, wherein peripheral devices of said array are fabricated in NMOS technology.

5. A non-volatile data storage cell comprising:
   a semiconductor substrate of one conductivity type;
   a first region of conductivity opposite that of the substrate, extending to the surface of said substrate, wherein said first region surrounds an enclosed region of said substrate, said enclosed region of substrate having a higher level of impurity concentration of the same conductivity type as said substrate for changing the breakdown voltage between said substrate and said first region of opposite conductivity;
   an insulating layer covering the surface of said substrate, said first region of opposite conductivity, and said enclosed region of substrate;
   a multidielectric structure overlying said enclosed substrate region and recessed into said insulating layer such that a reduced thickness of said insulating layer is present between said dielectric structure and said enclosed substrate region, than is present between said substrate and subsequent structure parts;
   a conductor arranged on the surface of said insulating layer to be in contact with said multilayer dielectric structure.

6. A cell as in claim 5, wherein said semiconductor substrate is P-type.

7. A cell as in claim 5, wherein said multilayer dielectric structure comprises:
   a layer of silicon dioxide upon said nitride layer;
   a layer of titanium dioxide of a form known as rutile upon said silicon dioxide layer.

8. A cell as in claim 5, wherein said multi-layer dielectric c structure comprises:
   a layer of silicon nitride upon said insulating layer and overlying said enclosed region of substrate; and
   a layer of silicon oxide upon said layer of nitride.

9. A non-volatile data storage cell comprising:
   a semiconductor substrate of one conductivity type;
   a first region of conductivity opposite that of the substrate, wherein said first region surrounds an enclosed region of said substrate, said enclosed region of substrate having a higher level of impurity concentration of the same conductivity type as said substrate and an overlap of the multidielectric structure extending over the junction of said first region of opposite conductivity and said enclosed substrate region for changing the breakdown voltage between said substrate and said first region of opposite conductivity;
   an insulating layer covering the surface of said substrate, said first region of opposite conductivity, and said enclosed region of substrate;
   a multidielectric structure overlying said enclosed substrate region and recessed into said insulating layer such that a reduced thickness of said insulating layer is present between said dielectric structure and said enclosed substrate region, than is present between said substrate and subsequent structure parts;
   a conductor, arranged on the surface of said insulating layer to be in contact with said multilayer dielectric structure.

* * * * *